United States Patent
Rockway et al.

(10) Patent No.: US 8,064,555 B1
(45) Date of Patent: Nov. 22, 2011

(54) INPUT/OUTPUT MULTI-LEVEL CHANNELIZER AMPLIFIER

(75) Inventors: John W. Rockway, San Diego, CA (US); Diana Arceo, San Diego, CA (US); Jeffery C. Allen, San Diego, CA (US); Karl Moeller, San Diego, CA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 546 days.

(21) Appl. No.: 12/358,029

(22) Filed: Jan. 22, 2009

(51) Int. Cl.
*H04B 1/10* (2006.01)
*H03F 3/04* (2006.01)
*H03F 3/68* (2006.01)

(52) U.S. Cl. ........ 375/349; 330/295; 330/310; 330/311; 330/124 R; 330/126

(58) Field of Classification Search .................. 375/286, 375/288, 260, 349; 330/3, 9, 295, 302, 304, 330/310, 311, 98, 124 R, 126
See application file for complete search history.

(56) References Cited

U.S. PATENT DOCUMENTS

| 6,411,653 | B1 | 6/2002 | Arunachalam et al. |
| 6,549,560 | B1 | 4/2003 | Maiuzzo et al. |
| 7,091,774 | B1* | 8/2006 | Smiley ....................... 330/124 R |
| 7,415,247 | B1 | 8/2008 | Vaisanen et al. |
| 2004/0037572 | A1* | 2/2004 | Matsuyama ................... 398/208 |
| 2004/0042572 | A1* | 3/2004 | Palaskas et al. ............... 375/349 |
| 2005/0220201 | A1* | 10/2005 | Laroia et al. .................. 375/260 |
| 2008/0214137 | A1 | 9/2008 | Qian |

* cited by examiner

*Primary Examiner* — Young T. Tse
(74) *Attorney, Agent, or Firm* — Ryan J. Friedl; Kyle Eppele

(57) ABSTRACT

A system includes an input multi-level channelizer, an output multi-level channelizer, and more than one amplifiers connected between the input and output channelizers. The input and output channelizers cover an operating frequency band. Each level of the input multi-level channelizer comprises a plurality of input channels, which may be bandpass filters, and may be grouped into input sub-channelizers. Each successive level of the input multi-level channelizer is configured to divide the incoming signals into smaller frequency bands. Each level of the output multi-level channelizer comprises a plurality of output channels, which may be bandpass filters, and may be grouped into output sub-channelizers. Each successive level of the output multi-level channelizer is configured to combine the incoming signals into larger frequency bands. The signal output from the output multi-level channelizer represents a filtered version of the signal input into the input multi-level channelizer.

14 Claims, 3 Drawing Sheets

INPUT/OUTPUT MULTI-LEVEL CHANNELIZER AMPLIFIER

FEDERALLY SPONSORED RESEARCH AND DEVELOPMENT

The Input/Output Multi-Level Channelizer Amplifier is assigned to the United States Government and is available for licensing for commercial purposes. Licensing and technical inquiries may be directed to the Office of Research and Technical Applications, Space and Naval Warfare Systems Center, San Diego, Code 2112, San Diego, Calif., 92152; voice (619) 553-2778; email T2@spawar.navy.mil. Reference Navy Case No. 99202.

BACKGROUND

The COMB Limiter Combiner (CLIC) described in U.S. Pat. No. 6,549,560 to Maiuzzo et al. prevents strong interfering signals in nearby frequencies from overloading the amplifier and limiter stages in the front end of communications receivers. CLIC operates by, in part, restricting inter-modulation products to the passband of a single bandpass filter. CLIC design has generally been limited to between 10 and 16 channels due to the effect of each CLIC channel on the performance of the other CLIC channels, as well as the increased difficulty in electrically aligning an increased number of CLIC channels.

For many applications, it is desirable to have a filtering device that can achieve the same performance as CLIC, while operating over a broad frequency range. As an example, consider the application of CLIC to the military UHF band of 225 MHz to 400 MHz. The Electromagnetic Compatibility (EMC) goal is specified in terms of the acceptable adjacent signal separation, which is the specified separation required between a receive signal and all co-site transmit signals. For the military UHF bands, the adjacent signal separation is usually 1 MHz to 5 MHz. Therefore, 35 CLIC sub-bands would be required for an adjacent signal separation of 5 MHz, while an adjacent signal separation of 1 MHz would require 175 CLIC sub-bands. Such amounts of sub-bands are not feasible given the limitations in CLIC design as discussed above.

A need exists for a filtering device that can achieve the same performance as CLIC, i.e. minimizing intermodulation and mitigating potential interfering signals, but includes significantly more channels to allow operation over a broad frequency range.

DETAILED DESCRIPTION OF SOME EMBODIMENTS

Figure 1:
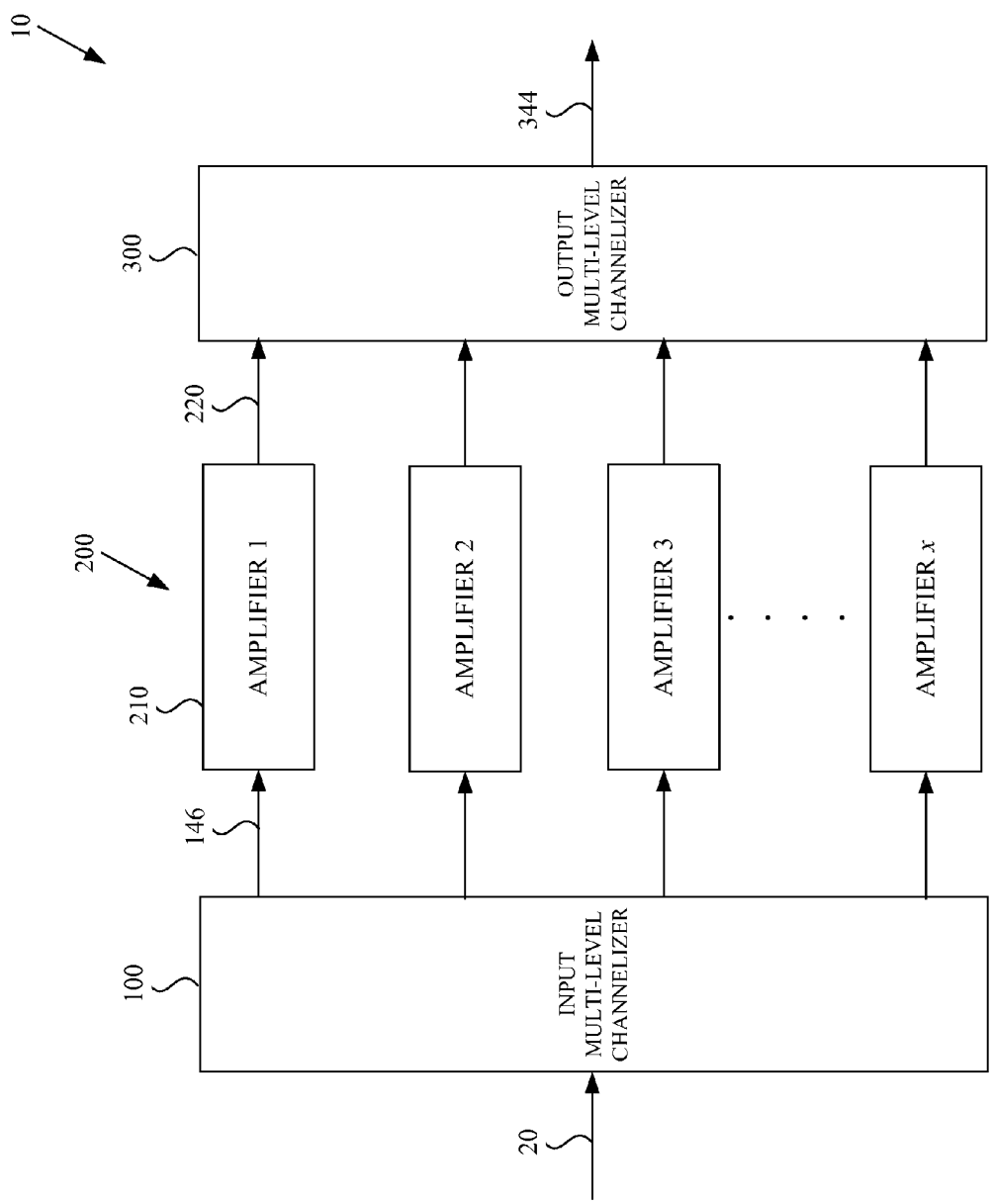
FIG. 1 shows a block diagram of a system in accordance with one embodiment of the Input/Output Multi-Level Channelizer Amplifier.

FIG. 1 shows a block diagram of a system 10 in accordance with one embodiment of the Input/Output Multi-Level Channelizer Amplifier. System 10 includes an input multi-level channelizer 100, a plurality of amplifiers 200, and an output multi-level channelizer 300. System 10 covers an operating frequency band, such as the entire military ultra-high frequency (UHF) band of 225 MHz to 400 MHz.

In operation, an input signal 20 enters input multi-level channelizer 100. Input signal may be any type of electromagnetic signal having a frequency within the operating frequency band. Input multi-level channelizer 100 channelizes input signal 20 into a plurality of signals covering smaller frequency bands than the operating frequency band. As an example, an input multi-level channelizer 100 covering the military UHF band may channelize input signal 20 into seven signals, with each signal covering a bandwidth of 25 MHz. The signals from input multi-level channelizer 100 are then input into x number of amplifiers 200, where x>1. As an example, a signal 146 from a channel of input multi-level channelizer 100 is input into a first amplifier 210.

Amplifiers 200 then amplify the received signal and output a plurality of output signals to output multi-level channelizer 300. As an example, amplifier 210 outputs signal 220 to output multi-level channelizer 300. Output multi-level channelizer 300 essentially performs the reverse function as input multi-level channelizer 100 to produce an output signal 344. More particularly, output multi-level channelizer 300 receives the plurality of signals from amplifiers 200, each signal covering a particular frequency band within the operating frequency band, and combines the signals into a single output signal that covers a larger frequency band. Signal 344 represents a filtered version of signal 20.

Figure 2:
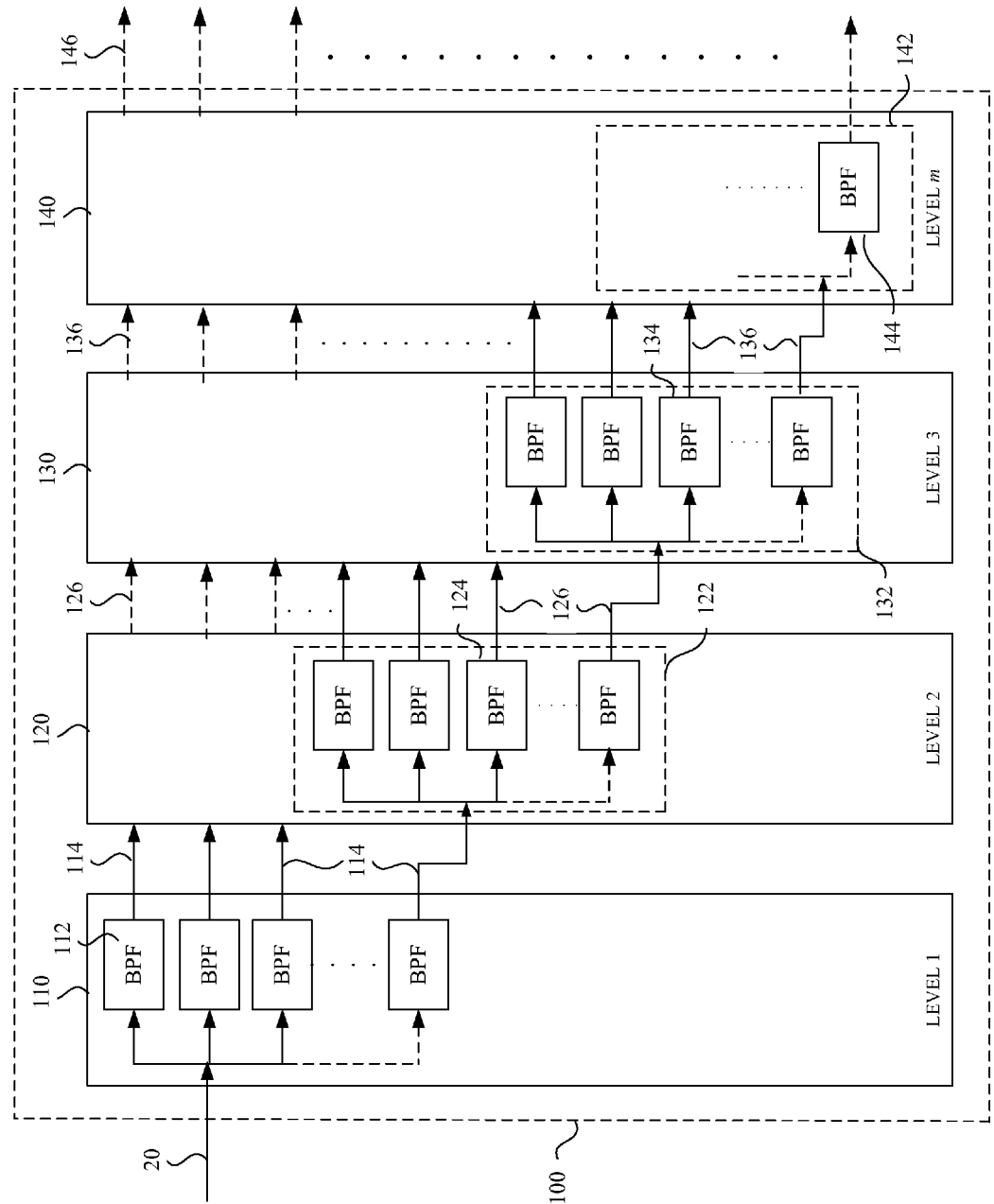
FIG. 2 shows a block diagram of an embodiment of an input multi-level channelizer, in accordance with one embodiment of the Input/Output Multi-Level Channelizer Amplifier.

FIG. 2 shows a block diagram of input multi-level channelizer 100. Input multi-level channelizer 100 may include a first level input channelizer and at least a second level input channelizer. In such embodiments, the input channelizers may include first level input channelizer 110 and at least second level input channelizer 120. In some embodiments, input multi-level channelizer 100 includes a plurality of input channelizers ranging from a first level input channelizer 110 to an $m^{th}$ level input channelizer 140, where m>2. Each input channelizer covers the operating frequency band of system 10.

First level input channelizer 110 may comprise a plurality of first level input channels 112. In some embodiments, first level input channels 112 comprise bandpass filters. Each of the first level input channels 112 may operate at a different frequency band within the operating frequency band.

Input multi-level channelizer 100 may also include a second level input channelizer 120 comprising a plurality of second level input sub-channelizers 122. The number of second level input sub-channelizers 122 is equal to the number of first level input channels 112. Each second level input sub-channelizer 122 is connected to a first level input channel 112 operating within the same frequency band. Each of the second level input sub-channelizers 122 comprise a plurality of second level input channels 124. In some embodiments, second level input channels 124 comprise bandpass filters.

In operation, signals 114 from first level input channelizer 110 are input into the second level input sub-channelizer 122 covering the appropriate frequency band. Signals 114 are then channelized into smaller frequency bands and passed to second level input channels 124. Second level input channels 124 are configured to process signals 114 and output signals 126. In embodiments of input multi-level channelizer 100 only containing two levels, signals 126 are sent to the input of amplifiers 200.

Input multi-level channelizer 100 may also include a third level input channelizer 130 comprising a plurality of third level input sub-channelizers 132. The number of third level input sub-channelizers 132 is equal to the number of second level input channels 124. Each third level input sub-channelizer 132 is connected to a second level input channel 124 operating within the same frequency band. Each of the third level input sub-channelizers 132 comprise a plurality of third level input channels 134. In some embodiments, third level input channels 134 comprise bandpass filters.

Signals 126 from second level input channelizer 120 are input into the third level input sub-channelizer 132 covering the appropriate frequency band. Signals 126 are then channelized into smaller frequency bands and passed to third level input channels 134. Third level input channels 134 is configured to process signals 126 and output signals 136. In embodiments of input multi-level channelizer 100 only containing three levels, signals 136 are sent to the input of amplifiers 200.

Input multi-level channelizer 100 may include further levels of input channelizers up to an $m^{th}$ level input channelizer 140, which may comprise a plurality of $m^{th}$ level input sub-channelizers 142 each containing a plurality of $m^{th}$ level input channels 144. In some embodiments, $m^{th}$ level input channels 144 comprise bandpass filters. As shown in FIG. 2, the $m^{th}$ level input channels 144 are configured to process signals 136 from third level input channelizer 130 and to output signals 146, which are sent to the input of amplifiers 200. In other embodiments of input multi-level channelizer 100 having more than four levels, $m^{th}$ level input channels 144 are configured to process signals 136 from an m−1 level input channelizer.

Figure 3:
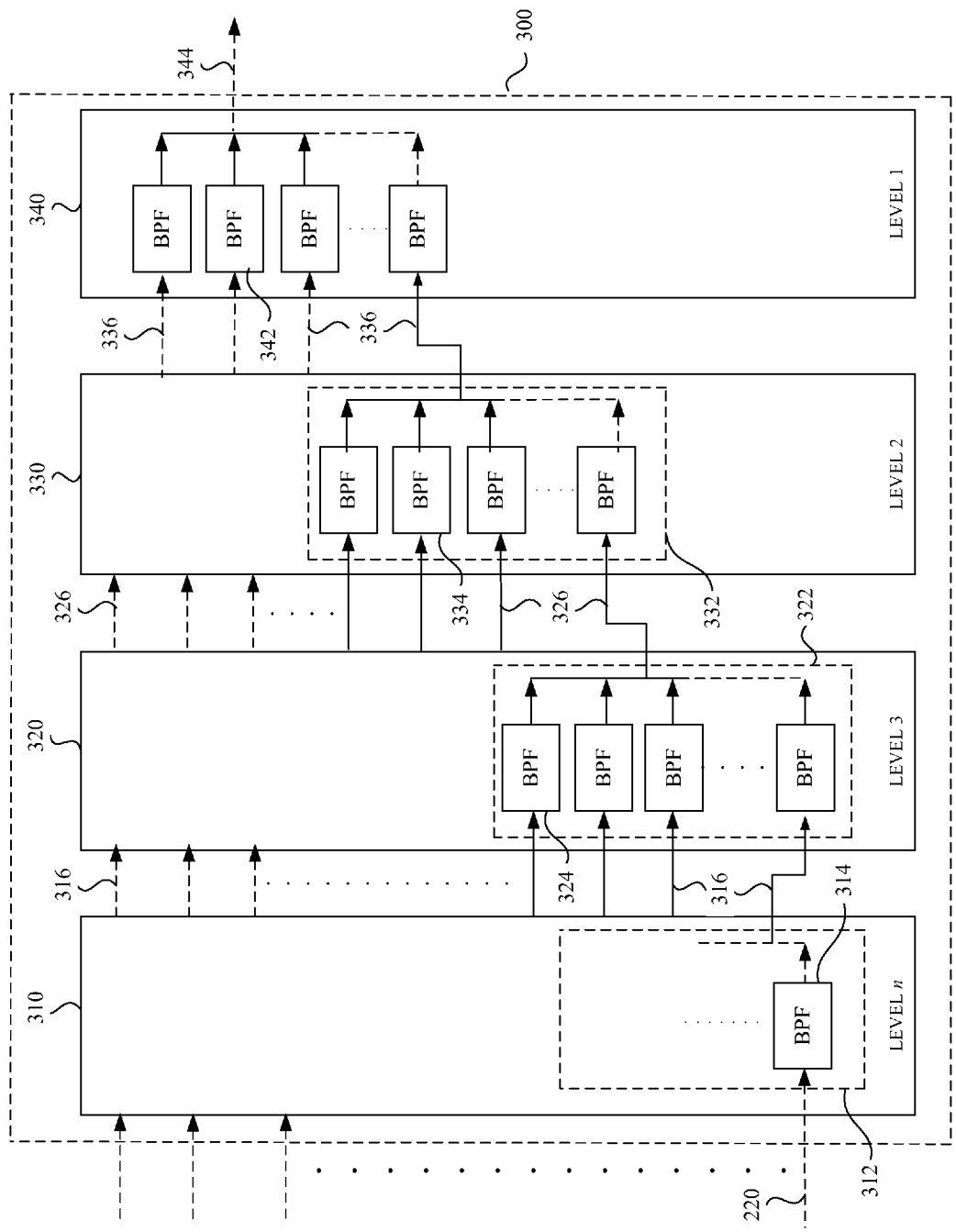
FIG. 3 shows a block diagram of an embodiment of an output multi-level channelizer, in accordance with one embodiment of the Input/Output Multi-Level Channelizer Amplifier.

FIG. 3 shows a block diagram of output multi-level channelizer 300. Output multi-level channelizer 300 may include at least a second level output channelizer and a first level output channelizer. In such embodiments, the output channelizers may include first level output channelizer 340 and at least second level output channelizer 330. In some embodiments, output multi-level channelizer 300 includes a plurality of output channelizers ranging from an $n^{th}$ level output channelizer 310 to a first level output channelizer 340, where n>2. Each output channelizer covers the operating frequency band of system 10.

The $n^{th}$ level output channelizer 310 may comprise a plurality of $n^{th}$ level output sub-channelizers 312 each containing a plurality of $n^{th}$ level output channels 314. In some embodiments, $n^{th}$ level output channels 314 comprise bandpass filters. Each of the $n^{th}$ level output channels 314 are connected to an output of one of the amplifiers 200, and are configured to receive signals 220 from amplifiers 200. Each of the $n^{th}$ level output channels 314 are configured to produce an output signal, which are combined into signals 316 and sent from $n^{th}$ level output sub-channelizers 312 to an n−1 level output channelizer. As shown, the n−1 level output channelizer is a third level output channelizer 320. However, in other embodiments, the n−1 level output channelizer may be second level output channelizer 330 or first level output channelizer 340.

Third level output channelizer 320 may comprise a plurality of third level output sub-channelizers 322. Each of the third level output sub-channelizers 322 may comprise a plurality of third level output channels 324. Signals 316 from the $n^{th}$ level output sub-channelizers 312 are input into third level output channels 324. Each of the third level output channels 324 are configured to produce an output signal, which are combined into signals 326 and sent from third level output sub-channelizers 322 to a second level output channelizer 330.

Second level output channelizer 330 may comprise a plurality of second level output sub-channelizers 332. Each of the second level output sub-channelizers 332 may comprise a plurality of second level output channels 334. Signals 326 from third level output sub-channelizers 322 are input into second level output channels 334. Each of the second level output channels 334 are configured to produce an output signal, which are combined into signals 336 and sent from second level output sub-channelizers 332 to first level output channelizer 340.

First level output channelizer 340 may comprise a plurality of first level output channels 342. Each of the first level output channels 342 are connected to a second level output sub-channelizer 332 operating within the same frequency band. Each of the first level output channels 342 are configured to produce an output signal, which are combined into signal 344 and output from output multi-level channelizer 300 and system 10.

In some embodiments, system 10 may be used to provide the equivalent of a very linear broadband high power amplifier. In such embodiments, input signal 20 may consist of a number of low power signals. Input multi-level channelizer 100 may direct each signal to the appropriate sub-band amplifier. Output multi-level channelizer 300 may combine the high power outputs of the amplifiers. Output multi-level channelizer 300 may also isolate each amplifier to avoid the generation of intermodulation products that generally occurs in wideband amplifiers with multi-signal inputs.

Many modifications and variations of the Input/Output Multi-Level Channelizer Amplifier are possible in light of the above description. Within the scope of the appended claims, the Input/Output Multi-Level Channelizer Amplifier may be practiced otherwise than as specifically described. Further, the scope of the claims is not limited to the implementations and embodiments disclosed herein, but extends to other implementations and embodiments as may be contemplated by those having ordinary skill in the art.

We claim:

1. A system comprising:
    an input channelizer covering an operating frequency band, the input channelizer comprising
        a first level input channelizer covering the operating frequency band, the first level input channelizer comprising a plurality of first level input channels, each of the first level input channels operating at a different frequency band within the operating frequency band, and
        at least a second level input channelizer covering the operating frequency band, the second level input channelizer comprising a plurality of second level input sub-channelizers equal to the number of the first level input channels, wherein each second level input sub-channelizer is connected to a first level input channel operating within the same frequency band, each of the second level input sub-channelizers comprising a plurality of second level input channels;
    an input of each of a plurality of amplifiers connected to each of the second level input channels; and
    an output channelizer covering the operating frequency band, the output channelizer comprising
        at least a second level output channelizer covering the operating frequency band, the second level output channelizer comprising a plurality of second level output sub-channelizers, each of the second level output sub-channelizers comprising a plurality of second level output channels, each of the second level output channels connected to an output of each of the plurality of amplifiers, and a first level output channelizer covering the operating frequency band, the first level output channelizer comprising a plurality of first level output channels, each of the first level output channels connected to a second level output sub-channelizer operating within the same frequency band.

2. The system of claim 1, wherein the number of the first level input channels equals the number of the first level output channels and the number of the second level input sub-channelizers equals the number of the second level output sub-channelizers.

3. The system of claim 1, wherein the first level input channels, the second level input channels, the second level output channels, and the first level output channels comprise bandpass filters.

4. The system of claim 1, wherein the system comprises m level input channelizers and m level output channelizers, where m>2.

5. The system of claim 1, wherein the system comprises m level input channelizers and n level output channelizers, where m>2 and n>2, where m is not equal to n.

6. The system of claim 1, wherein each of the second level input channels operates at a different frequency sub-band within the frequency band of the second level input sub-channelizer.

7. The system of claim 1, wherein each of the second level output channels operates at a different frequency sub-band within the frequency band of the second level output sub-channelizer.

8. The system of claim 1, wherein each of the first level output channels operates at a different frequency band within the operating frequency band.

9. A system comprising:
an input channelizer covering an operating frequency band, the input channelizer comprising
a first level input channelizer covering the operating frequency band, the first level input channelizer comprising a plurality of first level input channels, each of the first level input channels operating at a different frequency band within the operating frequency band, and
at least a second level input channelizer covering the operating frequency band, the second level input channelizer comprising a plurality of second level input sub-channelizers equal to the number of the first level input channels, wherein each second level input sub-channelizer is connected to a first level input channel operating within the same frequency band, each of the second level input sub-channelizers comprising a plurality of second level input channels;
an input of each of a plurality of amplifiers connected to each of the second level input channels; and
an output channelizer covering the operating frequency band, the output channelizer comprising
at least a second level output channelizer covering the operating frequency band, the second level output channelizer comprising a plurality of second level output sub-channelizers, each of the second level output sub-channelizers comprising a plurality of second level output channels, each of the second level output channels connected to an output of each of the plurality of amplifiers, and
a first level output channelizer covering the operating frequency band, the first level output channelizer comprising a plurality of first level output channels, each of the first level output channels connected to a second level output sub-channelizer operating within the same frequency band, and
wherein the number of the first level input channels equals the number of the first level output channels and the number of the second level input sub-channelizers equals the number of the second level output sub-channelizers,
wherein the first level input channels, the second level input channels, the second level output channels, and the first level output channels comprise bandpass filters.

10. The system of claim 9, wherein the system comprises m level input channelizers and m level output channelizers, where m>2.

11. The system of claim 9, wherein the system comprises m level input channelizers and n level output channelizers, where m>2 and n>2, where m is not equal to n.

12. The system of claim 9, wherein each of the second level input channels operates at a different frequency sub-band within the frequency band of the second level input sub-channelizer.

13. The system of claim 9, wherein each of the second level output channels operates at a different frequency sub-band within the frequency band of the second level output sub-channelizer.

14. The system of claim 9, wherein each of the first level output channels operates at a different frequency band within the operating frequency band.

* * * * *